United States Patent
Findley

(10) Patent No.: US 9,504,158 B2
(45) Date of Patent: Nov. 22, 2016

(54) METAL-FREE MONOLITHIC EPITAXIAL GRAPHENE-ON-DIAMOND PWB

(71) Applicant: David G. Findley, Forth Worth, TX (US)

(72) Inventor: David G. Findley, Forth Worth, TX (US)

(73) Assignee: Facebook, Inc., Menlo Park, CA (US)

(*) Notice: Subject to any disclaimer, the term of this patent is extended or adjusted under 35 U.S.C. 154(b) by 0 days.

(21) Appl. No.: 14/258,448

(22) Filed: Apr. 22, 2014

(65) Prior Publication Data
US 2015/0305158 A1    Oct. 22, 2015

(51) Int. Cl.
*H05K 1/03* (2006.01)
*H05K 1/16* (2006.01)
(Continued)

(52) U.S. Cl.
CPC ............ *H05K 1/162* (2013.01); *B28B 1/001* (2013.01); *B29C 67/0081* (2013.01); *B32B 18/00* (2013.01); *C04B 35/528* (2013.01); *C04B 35/532* (2013.01); *C04B 35/571* (2013.01); *H05K 1/0203* (2013.01); *H05K 1/032* (2013.01); *H05K 3/46* (2013.01); *B33Y 10/00* (2014.12); *B33Y 80/00* (2014.12); *C04B 2235/386* (2013.01); *C04B 2235/404* (2013.01); *C04B 2235/425* (2013.01); *C04B 2235/427* (2013.01);
(Continued)

(58) Field of Classification Search
CPC ............ H05K 1/03; H05K 1/11; H05K 3/00; H05K 7/20; A61N 1/05; B24D 3/06; C01B 31/10
USPC .......... 174/256, 255, 266; 361/705; 51/295, 51/307, 309; 423/446; 607/118
See application file for complete search history.

(56) References Cited

U.S. PATENT DOCUMENTS 5,506,295 A    4/1996 Kado et al.
5,516,884 A    5/1996 Bianconi
(Continued)

FOREIGN PATENT DOCUMENTS

JP    2009-209027    9/2009
WO    WO 2008086477    7/2008
(Continued)

OTHER PUBLICATIONS

Written Opinion and Search Report, Intellectual Property Office of Singapore, Application No. 10201503109X, Dated Nov. 6, 2015, Reported Nov. 12, 2015, 10 pages.
(Continued)

*Primary Examiner* — Xiaoliang Chen
(74) *Attorney, Agent, or Firm* — Baker Botts L.L.P.

(57) ABSTRACT

According to some embodiments, an apparatus includes a circuit board made of polycrystalline diamond. The circuit board is formed by deposition of layers of poly(hydridocarbyne). Each layer has the geometry of a cross section of the circuit board. The circuit board is further formed by pyrolysis of the layers of poly(hydridocarbyne) at a temperature greater than or equal to 100 degrees Celsius and less than or equal to 800 degrees Celsius. The apparatus additionally includes a plurality of tubes formed within the circuit board. The tubes have a plurality of terminations at one or more surfaces of the circuit board. Each tube comprises a layer of graphene that is operable to permit each tube to conduct electrical current. Each layer of graphene is formed by thermolysis of the polycrystalline diamond circuit board at a temperature greater than or equal to 900 degrees Celsius. Each tube is substantially hollow each layer of graphene forms an outer surface of the respective tube.

10 Claims, 12 Drawing Sheets

(51) Int. Cl.
    *H05K 1/02*      (2006.01)
    *H05K 3/46*      (2006.01)
    *B28B 1/00*      (2006.01)
    *B29C 67/00*     (2006.01)
    *B32B 18/00*     (2006.01)
    *C04B 35/528*    (2006.01)
    *C04B 35/532*    (2006.01)
    *C04B 35/571*    (2006.01)
    *B33Y 10/00*     (2015.01)
    *B33Y 80/00*     (2015.01)

(52) U.S. Cl.
    CPC ...... *C04B 2235/48* (2013.01); *C04B 2235/483* (2013.01); *C04B 2235/5288* (2013.01); *C04B 2235/5292* (2013.01); *C04B 2235/5454* (2013.01); *C04B 2235/6026* (2013.01); *C04B 2237/363* (2013.01); *C04B 2237/365* (2013.01); *C04B 2237/76* (2013.01)

(56) References Cited

U.S. PATENT DOCUMENTS

| | | |
|---|---|---|
| 6,989,428 B1 | 1/2006 | Bianconi et al. |
| 7,188,559 B1 | 3/2007 | Vecchio |
| 7,625,956 B2 | 12/2009 | Odell et al. |
| 8,013,109 B2 | 9/2011 | Toppare et al. |
| 8,038,795 B2 | 10/2011 | Barker et al. |
| 8,337,949 B2 | 12/2012 | Choi et al. |
| 8,348,409 B2 | 1/2013 | Wu |
| 8,367,035 B2 | 2/2013 | Rogers et al. |
| 8,491,964 B1 | 7/2013 | Morell et al. |
| 2004/0010108 A1 | 1/2004 | Bianconi et al. |
| 2005/0072979 A1 | 4/2005 | West et al. |
| 2005/0087903 A1 | 4/2005 | Farr et al. |
| 2006/0106184 A1 | 5/2006 | Bianconi et al. |
| 2006/0115772 A1 | 6/2006 | Hah et al. |
| 2008/0073126 A1 | 3/2008 | Shen et al. |
| 2010/0055491 A1 | 3/2010 | Vecchio et al. |
| 2010/0063248 A1 | 3/2010 | Toppare et al. |
| 2010/0085713 A1* | 4/2010 | Balandin ............... H01L 23/373 361/705 |
| 2010/0124611 A1 | 5/2010 | Mayo et al. |
| 2010/0264426 A1 | 10/2010 | Blair |
| 2010/0317132 A1 | 12/2010 | Rogers et al. |
| 2011/0169375 A1 | 7/2011 | Helvajian et al. |
| 2011/0282421 A1* | 11/2011 | Sung .................... C12N 5/0619 607/118 |
| 2012/0058350 A1 | 3/2012 | Long et al. |
| 2012/0102843 A1* | 5/2012 | Chakraborty ............. B22F 1/02 51/295 |
| 2012/0141799 A1* | 6/2012 | Kub ....................... B82Y 30/00 428/408 |
| 2012/0181501 A1 | 7/2012 | Sung |
| 2012/0248401 A1 | 10/2012 | Shin et al. |
| 2012/0258035 A1* | 10/2012 | Sumiya .................... B01J 3/062 423/446 |
| 2012/0315482 A1 | 12/2012 | Muramatsu et al. |
| 2013/0206461 A1 | 8/2013 | Sullivan Malervy et al. |
| 2013/0244121 A1 | 9/2013 | Gogotsi et al. |
| 2013/0256628 A1 | 10/2013 | Wei et al. |
| 2013/0280660 A1 | 10/2013 | Chang et al. |
| 2014/0060898 A1* | 3/2014 | Findley .................. H05K 3/284 174/255 |

FOREIGN PATENT DOCUMENTS

| | | |
|---|---|---|
| WO | WO 2008157550 | 12/2008 |
| WO | WO 2009158117 | 12/2009 |
| WO | WO 2012013622 | 8/2012 |
| WO | WO 2012148439 | 11/2012 |
| WO | WO 2013079618 | 6/2013 |

OTHER PUBLICATIONS

Dahlgren et al., "High-Pressure Polycrystalline Diamond as a Cost Effective Heat Spreader," IEEE, 2000, pp. 296-303.

Bianconi et al., "Diamond and Diamond-Like Carbon from a Preceramic Polymer," J.Am.Chem.Soc., 2004, vol. 126, pp. 3191-3202.

Fonoberov et al., "Giant Enhancement of the Carrier Mobility in Silicon Nanowires with Diamond Coating," Nano Letters, 2006, vol. 6, No. 11, pp. 2442-2446.

Kash et al., "Optical PCB Overview," IBM Corporation, 2009, pp. 1-17.

Osipov et al., "Rapid sintering of nano-diamond compacts," Diamond & Related Materials 18, 2009, pp. 1061-1064.

Chen, Yu-Chun, et al, "Inkjet printing of nanodiamond suspensions in ethylene glycol for CVD growth of patterned diamond structures and practical applications," Diamond & Related Materials 18, 2009, pp. 146-150.

de Heer et al., "Large area and structured epitaxial graphene produced by confinement controlled sublimation of silicon carbide," PNAS, vol. 108, No. 41, 2011, pp. 16900-16905.

Wu et al., "High-frequency, scaled graphene transistors on diamond-like carbon," Nature, vol. 472, 2011, pp. 74-78.

Khan et al., "Graphene-Multilayer Graphene Nanocomposites as Highly Efficient Thermal Interface Materials," American Chemical Society, Nano Letters, 2012, pp. 861-867.

Yu et al., "Graphene-on-Diamond Devices with Enhanced Current-Carrying Capacity: Carbon sp2-on-sp3 Technology," American Chemical Society, Nano Letters, 2012, pp. 1603-1608.

Mochalin et al., "The properties and applications of nanodiamonds," Nature Nanotechnology vol. 7, 2012, pp. 11-23.

Rath et al., "Diamond-integrated optomechanical circuits," Nature Communications, 2013, pp. 1-9.

Findley, entitled "Metal-Free Monolithic Epitaxial Graphene-on-Diamond PWB With Optical Waveguide," as U.S. Appl. No. 14/258,477, filed Apr. 22, 2014, 65 pages.

Communication from Intellectual Property Office of Singapore, Written Opinion for 10201503109X dated May 18, 2016; receipt date May 23, 2016; 5 pages.

* cited by examiner

Cross Section 310

Cross Section 320

US 9,504,158 B2

METAL-FREE MONOLITHIC EPITAXIAL GRAPHENE-ON-DIAMOND PWB

TECHNICAL FIELD OF THE INVENTION

This invention relates generally to three-dimensional (3-D) printing and in particular to 3-D printing a printed wiring board (PWB) using a diamond forming pre-ceramic polymer.

BACKGROUND

Three-dimensional (3-D) printing is an additive manufacturing process that allows for the manufacture of objects by "building up" an object. In contrast to subtractive techniques, such as machining, in which material is removed from a bulk material in order to form the shape of an object, 3-D printing lays down successive layers of material to form the shape of an object. Typical materials used for 3-D printing may include plastics, ceramics, and metals.

Printed wiring boards (PWBs) or circuit boards, are commonly used to connect electronic devices such as computer chips. PWBs are typically composed of layers of plastic and layers of metal, such as copper.

SUMMARY

According to some embodiments, an apparatus includes a circuit board made of polycrystalline diamond. The circuit board is formed by deposition or layers of poly (hydridocarbyne). Each layer has the geometry of a cross section of the circuit board. The circuit board is further formed by pyrolysis of the layers of poly(hydridocarbyne) at a temperature greater than or equal to 100 degrees Celsius and less than or equal to 800 degrees Celsius. The apparatus additionally includes a plurality of tubes formed within the circuit board. The tubes nave a plurality of terminations at one or more surfaces of the circuit board. Each tube comprises a layer of graphene that is operable to permit each tube to conduct electrical current. Each layer of graphene is formed by thermolysis of the polycrystalline diamond circuit board at a temperature greater than or equal to 900 degrees Celsius. Each tube is substantially hollow each layer of graphene forms an outer surface of the respective tube.

Technical advantages of certain embodiments may include using a diamond forming pre-ceramic polymer in a 3-D printer to form a diamond object. Some embodiments may provide methods of forming an object by depositing layers of multiple types of pre-ceramic polymers. Additional technical advantages of some embodiments may include formation of a circuit board composed primarily of polycrystalline diamond. Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE DRAWINGS

Embodiments of the present invention end its advantages are best understood by referring to FIGS. 1 through 13 of the drawings, like numerals being used for like and corresponding parts of the various drawings.

Diamond is a form of the element carbon that has many unique properties. Diamond is among the hardest known materials, has a high melting and boiling point, and is an excellent thermal conductor as well as electrical insulator. Objects made out of diamond may be able to take advantage of these properties. For example, tools made out of diamond, such as drill bits, saws, or knives, may be more durable than tools made of conventional materials due to the hardness of diamond. Diamond can be produced in a variety of ways including as a powder in the form of diamond nanoparticles and from the pyrolysis of a pre-ceramic polymer.

The teachings of the disclosure recognize that using three-dimensional (3-D) printing techniques with a pre-ceramic polymer and nanoparticle powder may allow for the creation of objects made of a variety of ceramics in a variety of useful shapes. In particular, using 3-D printing techniques with a diamond forming pre-ceramic polymer and a diamond nanoparticle powder may allow for the creation of diamond objects in a variety of shapes. For example, using 3-D printing with a diamond forming pre-ceramic polymer and a diamond nanoparticle powder, a diamond drill bit having almost any geometry could be printed. As other examples, 3-D printing with a diamond forming pre-ceramic polymer and a diamond nanoparticle powder may be used to print brake pad inserts, avionics bores, lightweight armor, diamond dialysis filters, vacuum micro-electronics, or any other appropriate object. Furthermore, by using different pre-ceramic polymers and nanoparticle powders separately or in addition to diamond forming pre-ceramic polymer and diamond nanoparticle powder, the properties of a printed object could be varied to meet various design objectives. Further, the teachings of this disclosure recognize that a nanoparticle powder that does not sinter may be used to support an object during the 3-d printing process. The following describes methods and systems of 3-D printing using a pre-ceramic polymer with a nanoparticle filler.

The teaching of the disclosure further recognize that using 3-D printing techniques with a pre-ceramic polymer may allow for the creation of a diamond printed wiring board (PWB). A diamond PWB may have numerous technical advantages due to the high thermal conductivity and low density of diamond compared to metals commonly used in PWBs. Additionally, the broad optical and infrared transparency of diamond may be used to facilitate optical and infrared data paths within the PWB (i.e. a waveguide).

Figure 1:
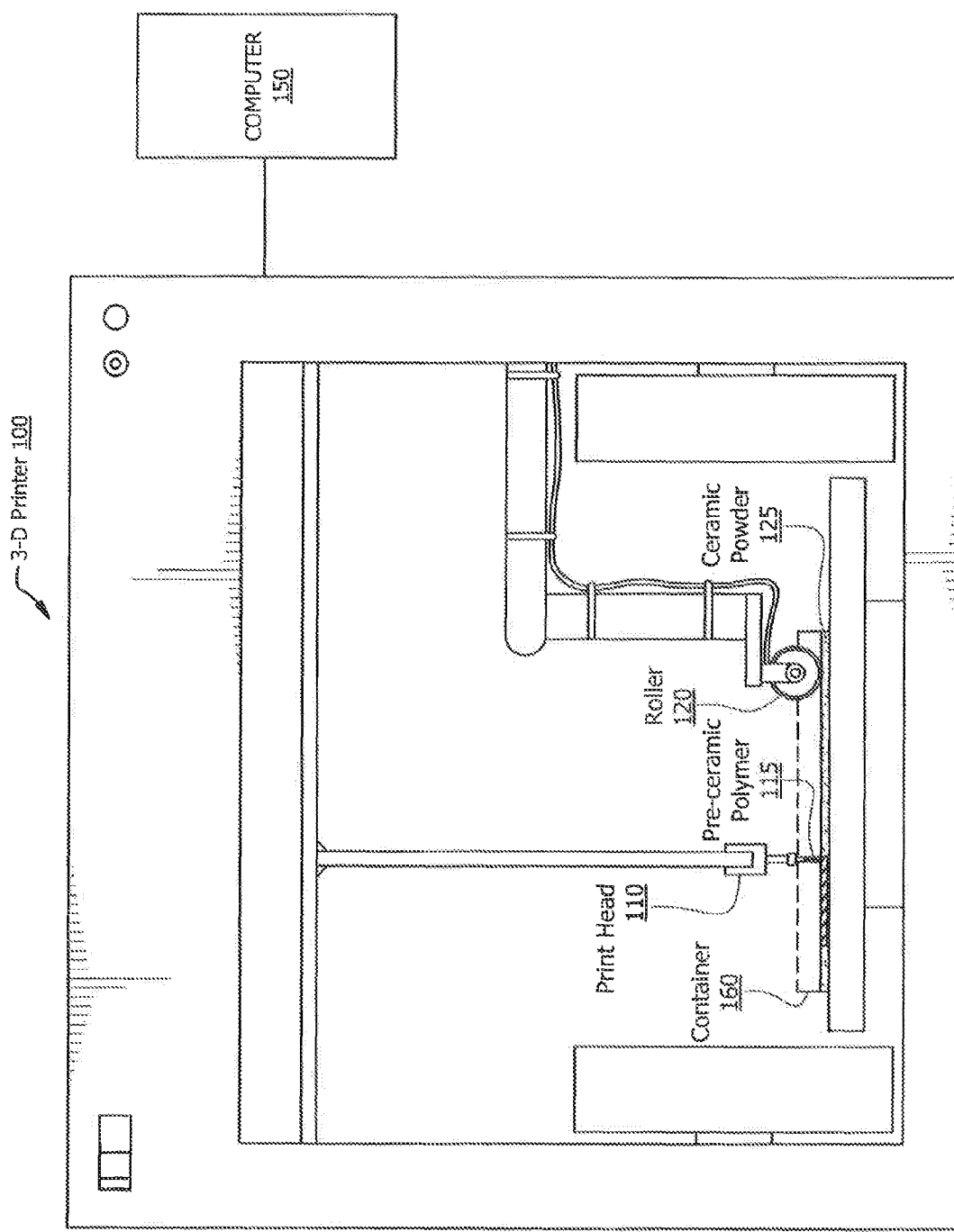
FIG. 1 illustrates an example of a 3-D printer, according to certain embodiments.

FIG. 1 illustrates an example embodiment of a 3-D printer 100. 3-D printer 100 includes a print head 110 and a roller 120. Roller 120 deposits layers of a ceramic powder 125 into a container 160. Print head 110 deposits a pre-ceramic polymer 115 dissolved in a solvent onto the layers of ceramic powder 125. In some embodiments, 3-D printer 100 may include a computer system 150 that controls the printing of an object by providing instructions to 3-D printer 100. Computer system 150 may be either external to 3-D printer 100 or incorporated into 3-D printer 100. Certain embodiments of computer system are discussed in more detail below with respect to FIG. 7.

In general, certain embodiments of 3-D printer 100 print 3-D diamond objects using roller 120 and print head 110. For example, 3-D printer 100 may print the 3-D object 200 illustrated in FIG. 2 by depositing successive layers of pre-ceramic polymer 115 through print head 110 onto layers of ceramic powder 125 that were deposited by roller 120 into container 160. Specifically, roller 120 may initially deposit a first layer of ceramic powder 125 into container 160. Print head 110 may then deposit a first layer of pre-ceramic polymer 115 onto the first layer of ceramic powder 125 in the shape of a first cross section or "slice" of the desired 3-D object. After a certain amount of time, roller 120 may then deposit a second layer of ceramic powder 125 on top of the first layer or ceramic powder 125 and first layer of pre-ceramic polymer 115. In some embodiments, the certain amount of time may be sufficient to allow for solvent to evaporate. Print head 110 may then deposit a second layer of pre-ceramic polymer 115 onto the second layer of ceramic powder 125 in the shape of a cross section of the object that is adjacent to and above the first cross section. Subsequent layers of ceramic powder 125 and pre-ceramic polymer 115 may be deposited in alternating fashion until the layers of pre-ceramic polymer 115 form the shape of the desired 3-D object.

Once all layers of pre-ceramic polymer 115 and ceramic powder 125 have been deposited in container 160 to form the shape of the desired 3-D object within ceramic powder 125, container 160 may then be placed into a furnace for baking. In some embodiments, baking may take place in an inert atmosphere. Unlike other methods in which excess powder may be removed prior to baking, excess ceramic powder 125 (i.e., ceramic powder 125 that was not sprayed with any pre-ceramic polymer 115) is not removed prior to baking but instead remains within container 160 during the baking process. This may provide additional advantages to prior processes by providing support for the 3-D object during baking. Once the baking is complete and after cooling, excess ceramic powder 125 is removed in order to reveal, the desired 3-D diamond object. The excess ceramic powder 125 may then be recycled and reused or discarded.

Print head 110 may be any commercially-available print head such as any ink jet or any aerosol jet print head. Depending on the type of print head 110 used, different feature sizes may be printed for an object. For example, an aerosol jet print head 110 may allow features as small as 10 microns to be printed. Print head 110 may be able to precisely control the volume of pre-ceramic polymer 115 deposited to ensure that pre-ceramic polymer 115 does not "soak through" the most recent layer of ceramic powder 125 into previously deposited layers of ceramic powder 125. While specific embodiments of print head 110 have been described, any appropriate system or method of depositing pre-ceramic polymer 115 onto ceramic powder 125 may be utilized. For example, certain embodiments of 3-D printer 100 may utilize techniques to deposit pre-ceramic polymer 115 onto ceramic powder 125 that do not involve any form of print head 110.

Roller 120 may be any device operable to deposit layers of ceramic powder 125. For example, roller 120 may be a roller that is fed by a hopper of ceramic powder 125. In alternative embodiments, roller 120 may be a nozzle that is able to uniformly deposit layers of ceramic powder 125. While specific systems of depositing ceramic powder 125 have been described, any appropriate system or method of depositing layers of ceramic powder 125 may be utilized. For example, certain embodiments of 3-D printer 100 may utilize techniques to deposit layers of ceramic powder 125 that do not involve any form of roller 120.

In some embodiments, pre-ceramic polymer 115 may be poly(hydridocarbyne) ("PHC"), poly(methylsilyne) ("PMS"), or any sp3-hybridized polymer. Pre-ceramic polymer 115 may react with itself (e.g. pyrolyze, thermolyze, or decompose) to form a ceramic above a certain temperature known as a decomposition, or pyrolysis, temperature of pre-ceramic polymer 115. In some embodiments, pre-ceramic polymer 115 may be dissolved in a solvent such as acetone, tetrahydrofuran, toluene, acetonitrile, an aprotic solvent, a mixture of any two or more of these solvents, and the like.

In some embodiments, after depositing a layer of pre-ceramic polymer 115 dissolved in a solvent, 3-D printer 100 may pause for a predetermined amount or time to allow the solvent, to evaporate before depositing another layer of ceramic powder 125. Because layers of pre-ceramic polymer 115 may be relatively thin in certain embodiments, a pause of several seconds or less may be sufficient to allow the solvent to evaporate. Allowing the solvent to evaporate after each layer of pre-ceramic polymer 115 is deposited may prevent the solvent from becoming entrained in ceramic powder 125 as subsequent layers of ceramic powder 125 and pre-ceramic polymer 115 are deposited. This may prevent any graphitic contaminate from forming within any 3-D printed object.

Ceramic powder 125 may be any appropriate nanoparticle filler. In some embodiments, ceramic powder 125 may be any one or a mixture of the following: detonation nanodiamond ("DND") powder, silicon carbide powder, graphene nano-platlet powder, graphene oxide nano-platelet powder, carbon nanotube powder, various fullerenes (such as Buckminsterfullerenes), boron nitride nano-platelet powder, a carbide forming metal powder, or any other powder that will not sinter at the decomposition temperature of pre-ceramic polymer 115. Examples of carbide forming metals include, but are not limited to, titanium, hafnium, and tungsten. In some embodiments, an average particle diameter of ceramic powder 125 may be less than a colloidal particle diameter of pre-ceramic polymer 115. In some embodiments, the average particle diameter of ceramic powder 125 may be less than 30 nanometers. One example of a possible ceramic powder 125, DND, may be formed by the detonation of explosives in an enclosed chamber in an inert atmosphere. The resulting nanodiamonds may have a diameter between 2 and 20 nanometers. Through processing, a powder of nanodiamonds having diameters of 4 to 5 nanometers may be created. Detonation nanodiamonds have a cubic crystal structure, like that of most naturally occurring diamond.

In some embodiments, 3-D printer 100 may be controlled by computer system 150. Computer system 150 may be any suitable computer system in any suitable physical form. In general, computer system 150 may store a digital representation of a 3-D object and provide 3-D printer 100 with information to print the 3-D object. For example, computer system 150 may store a 3-D computer aided design (CAD) model of an object and provide the model to 3-D printer 100 when printing the object.

Computer system 150 may be integrated into 3-D printer 100, connected to 3-D printer 100, or be multiple computer systems both integrated into 3-D printer 100 and separate from 3-D printer 100. As an example and not by way of limitation, computer system 150 may be a virtual machine (VM), an embedded, computer system, a system-on-chip (SOC), a single-board computer system (SBC) (e.g., a computer-on-module (COM or a system-on-module (SOM)), a desktop computer system, a laptop or notebook computer system, a mainframe, a mesh of computer systems, a server, an application server, or a combination of two or more of these. Where appropriate, computer system 150 may include one or more computer systems 150; be unitary or distributed; span multiple locations; span multiple machines; or reside in a cloud, which may include one or more cloud components in one or more networks. Where appropriate, one or more computer systems 150 may perform without substantial spatial or temporal limitation one or more steps of one or more methods described or illustrated herein. As an example and not by way of limitation, one or more computer systems 150 may perform in real time or in batch mode one or more steps of one or more methods described or illustrated herein. One or more computer systems 150 may perform at different times or at different locations one or more steps of one or more methods described or illustrated herein, where appropriate. A particular embodiment of computer system 150 is described in more detail below in reference to FIG. 7.

Figure 2:
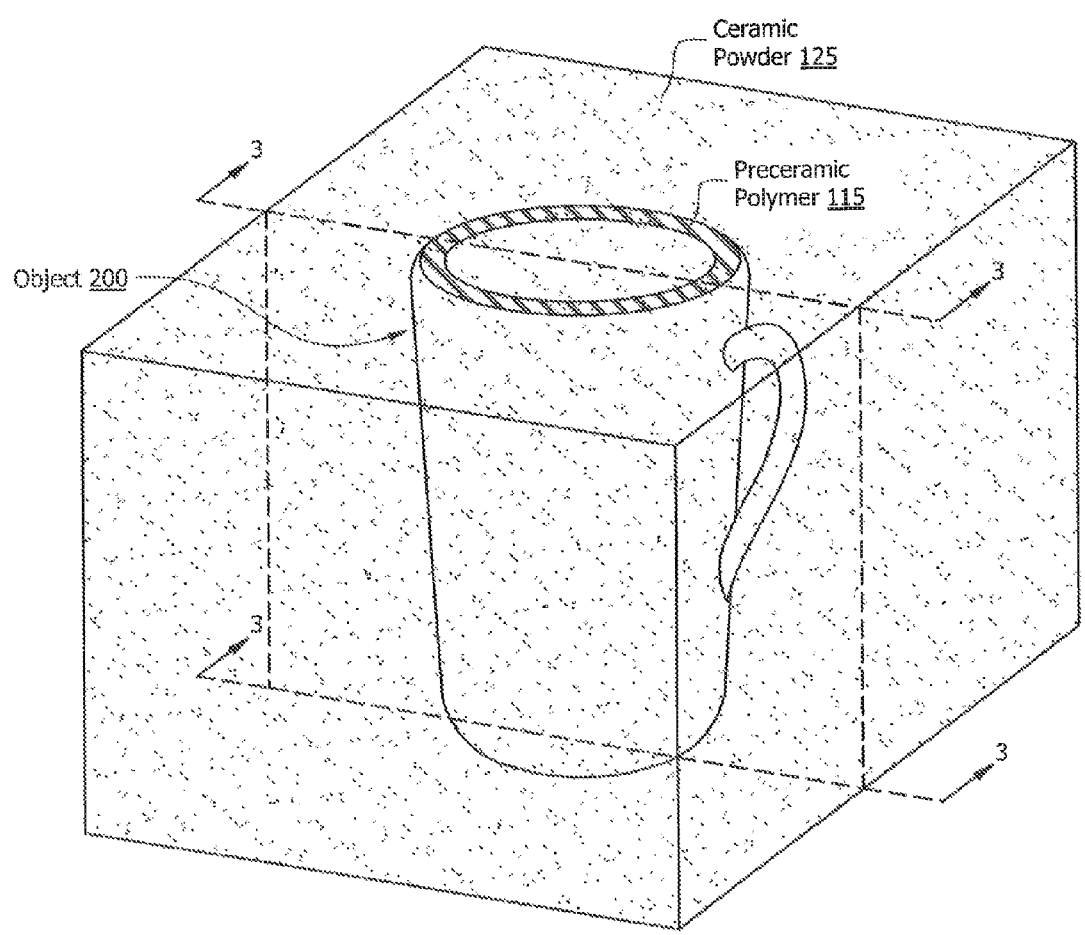
FIG. 2 illustrates an object printed by the 3-D printer of FIG. 1 within ceramic powder, according to certain embodiments.

FIG. 2 illustrates an example of a 3-D printed object 200 printed by 3-D printer 100 within excess ceramic powder 125. When all layers of ceramic powder 125 and pre-ceramic polymer 115 have been deposited, the volume of ceramic powder 125 onto which pre-ceramic polymer 115 was deposited will be in the shape of object 200 within ceramic powder 125. Pre-ceramic polymer 115 may act as a binder, binding ceramic powder 125 together in the areas where print head 110 deposited pre-ceramic polymer 115. The remaining excess ceramic powder 125 may act as a support for the object. For example, the excess ceramic powder 125 may keep thin sections of object 200 from collapsing.

Figure 3:
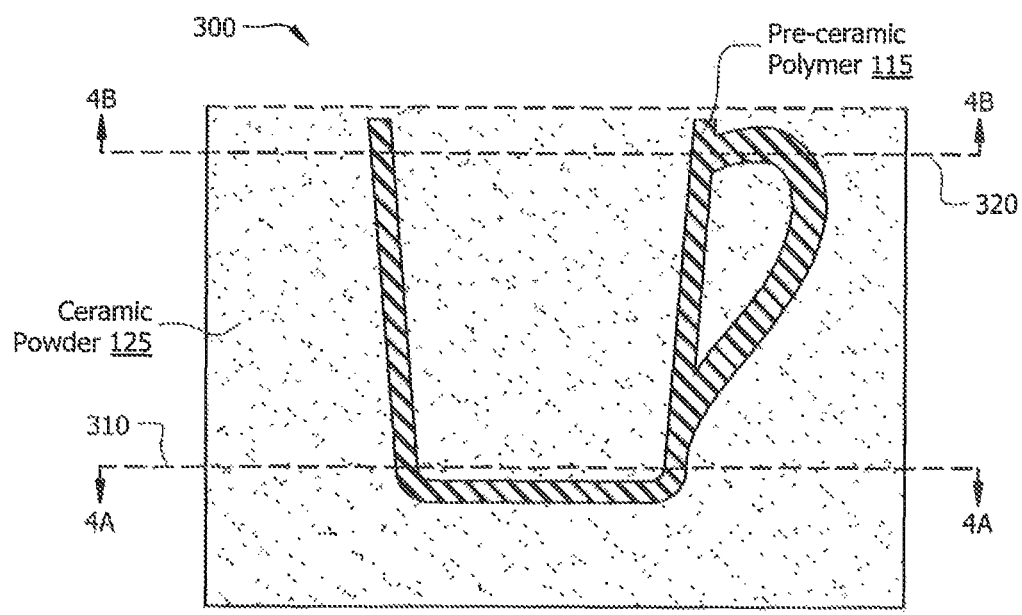
FIG. 3 illustrates a vertical cross section of the 3-D printed object illustrated in FIG. 2, according to certain embodiments.
Figure 4A:
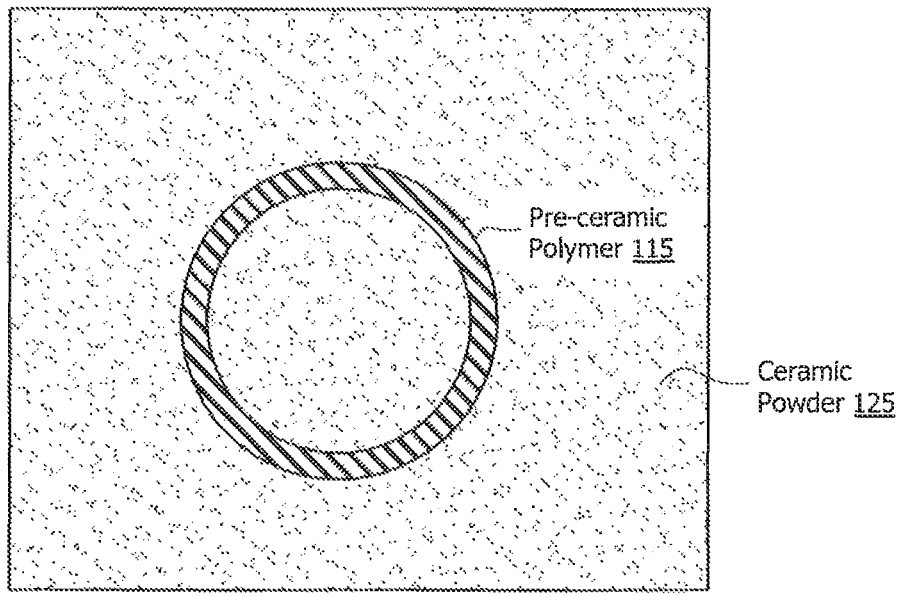
FIGS. 4A and 4B illustrate horizontal cross sections of the 3-D printed object illustrated in FIG. 2, according to certain embodiments.
Figure 4B:
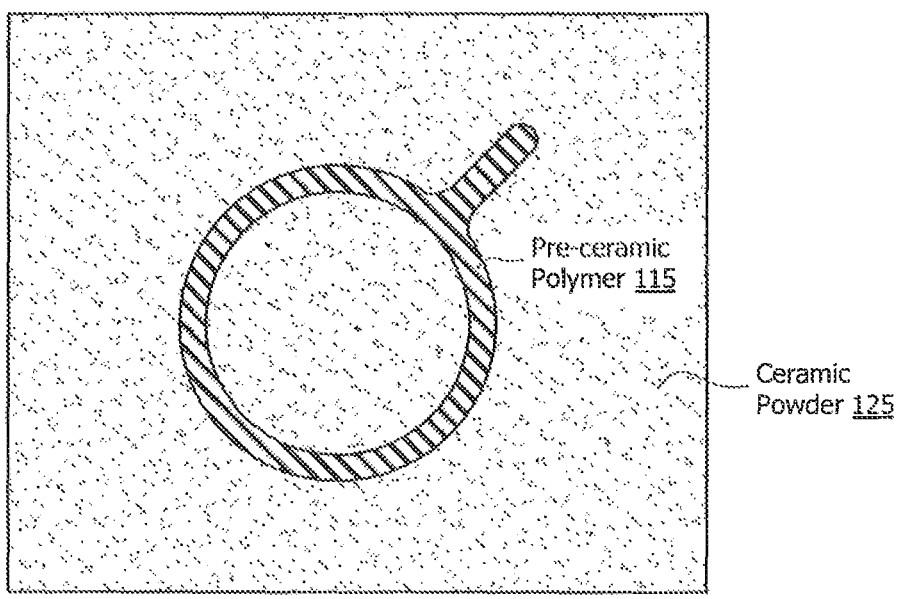

FIG. 3 illustrates an example of a vertical cross section 300 of 3-D printed object 200 illustrated in FIG. 2. Vertical cross section 300 illustrates how a pattern of pre-ceramic polymer 115, when deposited onto subsequent layers of ceramic powder 125, forms the shape of object 200. FIG. 3 also includes horizontal cross sections 310 and 320, which are illustrated in FIGS. 4A and 4B. Horizontal cross section 310 corresponds to a horizontal cross section of pre-ceramic polymer 115 that may be deposited near the bottom of object 200 illustrated in FIG. 2. Horizontal cross section 320 corresponds to a horizontal cross section of pre-ceramic polymer 115 that may be deposited near the top of object 200 illustrated in FIG. 2.

Figure 5A:
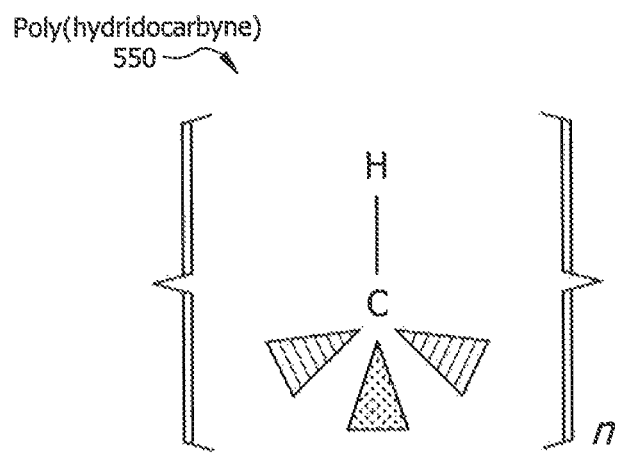
FIG. 5A illustrates the chemical structure of the pre-ceramic polymer poly(hydridocarbyne)

FIG. 5A illustrates the chemical structure of poly(hydridocarbyne), which may be used for pre-ceramic polymer 115 in some embodiments. Poly(hydridocarbyne) may pyrolyze to form diamond-like carbon or polycrystalline diamond when heated to a decomposition temperature such as between about 100 degrees Celsius and 300 degrees Celsius in an inert atmosphere. Upon sustained heating at or above the decomposition temperature for a predetermined amount of time (e.g., 12 to 24 hours), diamond-like carbon may anneal to form polycrystalline diamond. Diamond formed by pyrolysis of poly(hydridocarbyne) may nave a hexagonal crystal structure. Diamond having a hexagonal crystal structure is also known as lonsdaleite. At its pyrolysis temperature, poly(hydridocarbyne) may react with the surface of ceramic powder 125 and bond to it. For example, if ceramic powder 125 is comprised of DND, poly(hydridocarbyne) may react to form polycrystalline diamond bonded to the DND. As a result, after heating, the 3-D printed object will be composed of polycrystalline diamond. More specifically, the object may be composed of cubic crystal structure DND bonded within polycrystalline hexagonal diamond. By 3-D printing using DND and poly(hydridocarbyne), objects comprised entirely of solid diamond may be printed in almost any shape. For example, drill heads used for boring through the earth, such as drill heads with complex geometries that are used in the oil industry, could be printed using DND and poly(hydridocarbyne) to form a polycrystalline diamond drill head.

If a carbide-forming metal powder is used as ceramic powder 125, the poly(hydridocarbyne) may react with the surface of the metal particles to form metal carbide bonds. For example, if tungsten powder is used as ceramic powder 125, the 3-D printed object after heating may comprise tungsten particles suspended in a polycrystalline diamond matrix, with the polycrystalline diamond bonded to the surface of the tungsten particles by tungsten carbide bonds. In particular embodiments, the metal particles may completely react with the poly(hydridocarbyne) to form a homogenous metal carbide.

Figure 5B:
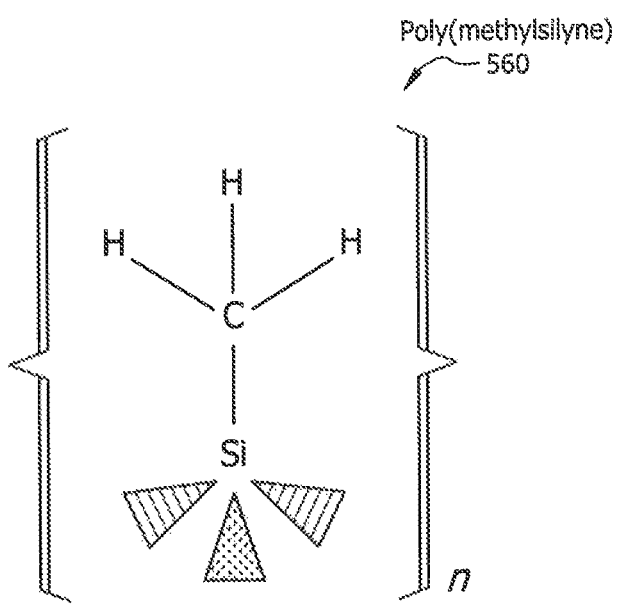
FIG. 5B illustrates the chemical structure of the pre-ceramic polymer poly(methylsilyne)

FIG. 5B illustrates the chemical structure of poly(methylsilyne), which may be used for pre-ceramic polymer 115 in some embodiments. Poly(methylsilyne) may pyrolyze to form silicon carbide when heated to a decomposition temperature such as between about 100 degrees Celsius and 800 degrees Celsius. At its pyrolysis temperature, poly(methylsilyne) may react with the surface of ceramic powder 125 and bond to it. For example, if ceramic powder 125 is comprised of DND, poly(methylsilyne) may react to form silicon carbide bonded to the DND. As a result, after heating, the 3-D printed object may be composed of cubic crystal structure detonation nanodiamonds within a silicon carbide matrix, with the silicon carbide bonded to the surface of the detonation nanodiamonds. If the ceramic powder comprises silicon carbide powder, poly(methylsilyne) will react to form silicon carbide bonded to the silicon carbide powder, forming a 3-D object of polycrystalline silicon carbide.

In operation of example embodiments, 3-D printer 100 may print object 200 by depositing alternating layers of ceramic powder 125 and pre-ceramic polymer 115. 3-D printer 100 may deposit pre-ceramic polymer 115 in the shape of cross sections of the object being printed, such as those illustrated in FIGS. 4A and 4B. In some embodiments, the 3-D printing of object 200 using pre-ceramic polymer 115 and ceramic powder 125 may take place in an inert atmosphere. Examples of inert gases include, but are not limited to, argon, nitrogen, neon, xenon, and the like. Depositing layers of pre-ceramic polymer 115 and ceramic powder 125 in an inert atmosphere prevents oxygen from becoming entrained in object 200 and in excess ceramic powder 125 in which print head 110 did not deposit pre-ceramic polymer 115 and also may prevent oxidation of pre-ceramic polymer 115.

After 3-D printer 100 deposits all layers of ceramic powder 125 and pre-ceramic polymer 115, object 200 and excess ceramic powder 125 may be baked to a temperature at or above the decomposition temperature of pre-ceramic polymer 115 and below the sintering temperature of ceramic powder 125. In some embodiments, this temperature range may be between about 100 degrees Celsius and 800 degrees Celsius. In certain embodiments, 3-D printer 100 may incorporate a heater or oven to bake the printed layers of pre-ceramic polymer 115 and ceramic powder 125. In an alternative embodiment, the printed layers of pre-ceramic polymer 115 and ceramic powder 125 may be moved to an oven for baking after printing. For example, the layers of pre-ceramic polymer 115 and ceramic powder 125 may be deposited in container 160 in some embodiments and container 160 may be moved to an oven for baking after printing. In an alternative embodiment, optical photo-pyrolysis may also be used to "expose" or pyrolize each entire printed layer of pre-ceramic polymer 115. In such an embodiment, there may be no need to bake the final item as it is converted layer-by-layer to diamond like carbon and/or diamond during each photo-pyrolysis exposure.

In some embodiments, the baking occurs at any temperature in which ceramic powder 125 may remain a powder and pre-ceramic polymer 115 decomposes. For example, the baking may occur at a decomposition temperature that is between about 100 degrees Celsius and about 800 degrees Celsius. For example, the baking may occur at a temperature that is at least 100 degrees Celsius, plus or minus 0%-1%, 1%-5%, 5%-10%, or 10%-20%, but is less than 800 degrees Celsius, plus or minus 0%-1%, 1%-5%, 5%-10%, or 10%-20%. While specific baking temperatures have been disclosed, it should be noted that any appropriate temperature in which ceramic powder 125 remains a powder (i.e. any temperature at which ceramic powder 125 does not sinter to itself) while pre-ceramic polymer 115 decomposes may be utilized.

In some embodiments, the baking occurs in an inert atmosphere such as nitrogen, argon, xenon, neon, and the like. Baking in an inert atmosphere may prevent the printed pre-ceramic polymer 115 and ceramic powder 125 from reacting with any oxygen in the air. In some embodiments, if 3-D printer 100 printed an object in the presence of oxygen, the oxygen may additionally or alternatively be purged from the printed pre-ceramic polymer 115 and ceramic powder 125 before baking. To remove entrained oxygen before baking, the printed pre-ceramic polymer 115 and ceramic powder 125 may be placed in a vacuum or inert atmosphere to allow the oxygen to diffuse out. Removal of entrained oxygen may take an extended period of time (e.g., up to twenty four hours). Given the amount of time required to purge oxygen from the printed pre-ceramic polymer 115 and ceramic powder 125, 3-D printing in an inert atmosphere may be desirable in order to expedite the 3-D printing process.

As mentioned above, the decomposition temperature may be between about 100 degrees Celsius and about 800 degrees Celsius. Pre-ceramic polymer 115 may react with itself and with the surface of particles of ceramic powder 125 at this temperature. In this temperature range, particles of ceramic powder 125 will not sinter, meaning they will not react with, or bind to, other particles of ceramic powder 125. Therefore, ceramic powder 125 may remain a powder at the temperatures at which pre-ceramic polymer 115 decomposes. The excess ceramic powder 125 that is not in contact with pre-ceramic polymer 115 may act as a support for the printed object during heating.

After heating the ceramic powder 125 containing pre-ceramic polymer 115, excess ceramic powder may be removed from the object. The excess ceramic powder may be recycled and used to print another 3-D object. 3-D printer 100 may remove excess ceramic powder 125 from the 3-D diamond object using a brush, vacuum, compressed air, or any other appropriate tool. Excess ceramic powder 123 may also be removed manually after heating.

In some embodiments, 3-D printer 100 may be able to print a layer of ceramic powder 125 and a layer of pre-ceramic polymer 115 continuously. In such an embodiment, 3-D printer 100 may have multiple rollers 120 and print heads 110 in order to print multiple layers continuously. Multiple rollers 120 and print heads 110 may be arranged sequentially on a moving line which feeds directly into a heater or oven to heat the printed layers. In such an embodiment, the printed object may be a thin continuous object, such as a printed cloth that can be rolled upon exit from the oven.

In some embodiments, 3-D printer 100 may print object 200 using multiple ceramic powders 125 and pre-ceramic polymers 115. The use of different ceramic powders 125 may produce objects having different properties. Properties that may depend on the choice of ceramic powders 125 include toughness, hardness, yield strength, density, friction, electrical conductivity, thermal conductivity, thermal expansion coefficient, optical transparence, index of refraction, or otter physical properties, in a printed object. For example, printing an object using carbon nanotube powder may result in an object that is tougher than one printed using DND, while objects printed using DND may be harder than those printed using carbon nanotube powder.

In some embodiments, certain ceramic powders 125 may also be mixed to tune the desired properties of object 200. For example, a mixture of carbon nanotubes and DND may be used as ceramic powder 125 to create an object 200 having desired levels of toughness and hardness. Additionally, roller 120 may deposit layers of different ceramic powders 125. For example, roller 120 may deposit a first layer of DND, followed by a layer of Buckminsterfullerenes. Depositing layers of different ceramic powers 125 allows the printing of an object with desirable properties. For example, printing an object with layers that alternate between being hard and being tough may allow for the creation of an object with properties desirable as an armor. As one example, an armor having alternating layers of diamond and metal carbide may be printed.

Figure 7:
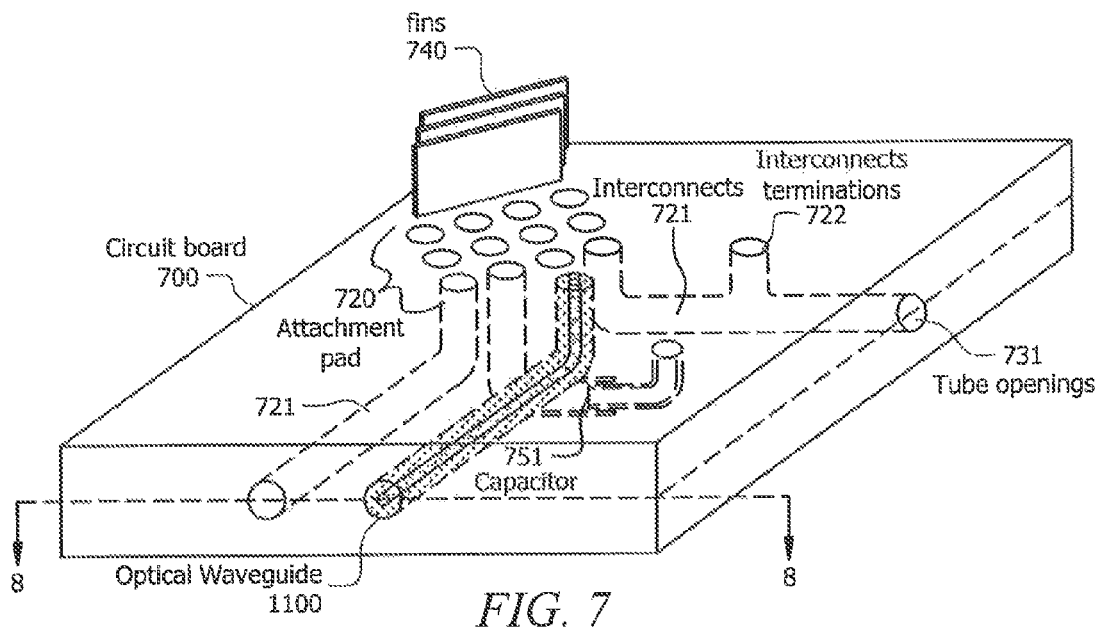
FIG. 7 illustrates an example embodiment of a polycrystalline diamond printed wiring board (PWB) that may be printed using a 3-D printer, according to certain embodiments.

In some embodiments, print head 110 may deposit both poly(hydridocarbyne) and poly(methylsilyne) to print object 200. For example, poly(hydridocarbyne) could be used to print some layers of an object and poly(methylsilyne) could be used to print other layers of the object. Similarly, poly (hydridocarbyne) could be used to print a section of an object and poly(methylsilyne) could be used to print another section. For example, poly(hydridocarbyne) could be used to print the handle portion of object 200 illustrated in FIG. 2 and poly(methylsilyne) could be used to print the cup portion of object 200. In some embodiments, poly(hydridocarbyne) could be printed onto a layer of a first type of ceramic powder 125 and poly(methylsilyne) could be printed onto a layer of a second type of ceramic powder 125. Printing objects 200 using multiple types of ceramic powders 125 and both poly(methylsilyne) and poly(hydridocarbyne) may allow for the creation of objects that would be otherwise difficult to manufacture. For example, an object having both structural elements and integral electronic elements may be printed. For example, a missile radome could be printed out of diamond with a silicon carbide outer coating to prevent oxidation of the diamond at high temperatures. Such a radome may incorporate elements of a printed wiring board (PWB), as illustrated in FIG. 7. For example, a radome may have interconnects such as internal graphene-coated tubes to act as integral radio frequency antennae and other internal graphene tubes with data processing chips placed directly onto the internal radome surface. Such an object could be printed by using layers of DND and poly(hydridocarbyne) to form the structure of the radome, and using silicon carbide powder and poly(methylsilyne) to form the outer surface of the radome.

Figure 6:
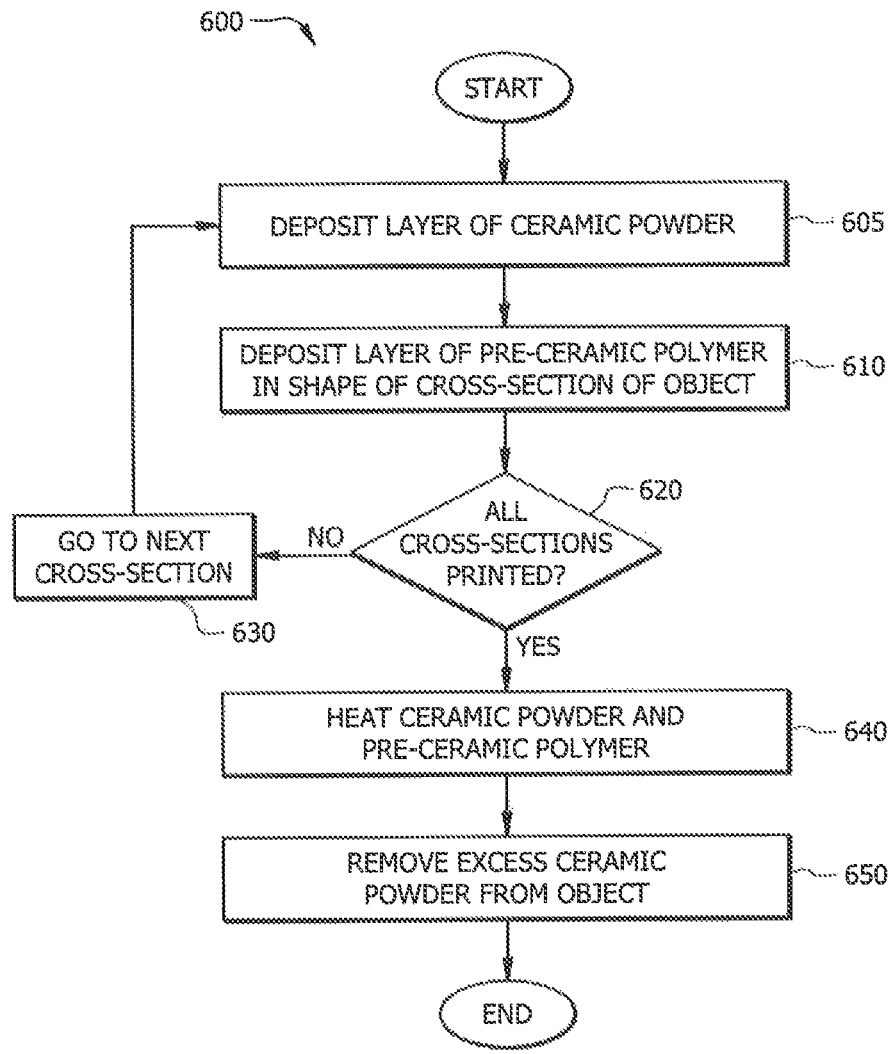
FIG. 6 illustrates a method of printing a 3-D object in a ceramic powder using a pre-ceramic polymers according to certain embodiments.

FIG. 6 illustrates a method 600 for printing a 3-D object such as object 200 in a ceramic powder using a pre-ceramic polymer. Method 600 may be implemented by 3-D printer 100. Method 600 begins at step 605 where a layer of ceramic powder is deposited. In some embodiments, the layer of ceramic powder is deposited by an apparatus such as roller 120 or any other suitable method. In some embodiments, the ceramic powder deposited in step 605 may be ceramic powder 125 discussed above. In some embodiments, the ceramic powder may be deposited into a container such as container 160 above. At step 610, a layer of pre-ceramic polymer is deposited in the shape of a cross section of the desired object onto the layer of ceramic powder deposited in step 605. In some embodiments, the pre-ceramic polymer is deposited in step 610 by print head 110 or any other appropriate apparatus. In some embodiments, the pre-ceramic polymer is pre-ceramic polymer 115 above. After depositing the pre-ceramic polymer in step 610, some embodiments of method 600 may pause to allow any solvent within the pre-ceramic polymer to evaporate.

At step 620, all layers of pre-ceramic polymer needed to form the object have not been deposited, 3-D printer 100 will select the next cross section to be printed and move back to step 605 where a new layer of ceramic powder is deposited. At step 610, pre-ceramic polymer 115 is deposited in the shape of the next cross section of the object. When all cross sections nave been printed, method 600 proceeds to step 640.

At step 640, the printed ceramic powder and pre-ceramic polymer is heated at or above the pre-ceramic polymer's decomposition temperature. At this temperature, the pre-ceramic polymer may react to form a ceramic and may bind to the ceramic powder. In some embodiments, step 640 occurs in an inert atmosphere as described above. In particular embodiments, optical photo-pyrolysis may also be used to "expose" or pyrolize each entire printed layer of pre-ceramic polymer. In such an embodiment, there may be no need to bake the final item as it is converted layer-by-layer to diamond like carbon and/or diamond during each photo-pyrolysis exposure.

After heating in step 640, some embodiments of method 600 proceed to step 650 where excess ceramic powder that is not in contact with the reacted pre-ceramic polymer is removed. In some embodiments, the excess powder may be either removed mechanically (e.g., by 3-D printer 100) or manually removed. In some embodiments, the excess ceramic powder is recycled or discarded.

After printing, heating, and removal of excess ceramic powder, the object may be subjected to additional processing steps to prepare the object for use. Examples of post-printing processing may include: painting the object, polishing the object, treating the surface of the object to render it chemically inert or to make it chemically active, and assembly of another object or device from multiple printed objects.

FIG. 7 illustrates an example embodiment of a circuit board 700, sometimes referred to as a printed wiring board (PWB), that may be printed using 3-D printer 100, according to certain embodiments. Circuit hoard 700 includes attachment pad 720, interconnects 721 ("tubes"), interconnect, terminations 722, tube openings 731, fins 740, and capacitor 751. Attachment pad 720 may contain a pattern of one or more interconnect terminations 722 and serve as an attachment point for any electronic device such as a capacitor, resistor, computer chip, processor, memory chip, or other appropriate device coupled to circuit hoard 700.

Interconnects 721 may conduct signals between electronic devices attached to interconnect terminations 722. In particular embodiments, interconnects 721 may conduct, electrical signals or electrical power. In other embodiments, interconnects 721 may be optical or infrared waveguides that carry signals transmitted by light, as discussed in more detail below in. reference to FIGS. 11A-11C. Interconnect terminations 722 may provide an attachment point for contacts of computer chips that may be mounted to circuit board 700. Tube openings 731 may be open to the atmosphere to allow the pressure within interconnects 721 to be equalized to the surrounding environment. In some embodiments, some interconnects 721 may have tube openings 731 and some interconnects 721 may not have tube openings 731. Fins 740 may serve to conduct heat away from circuit board 700 and transfer heat generated by circuit board 700 or any components attached to circuit board 700 to the surrounding environment. Capacitor 751 may be a capacitor formed within circuit board 700 during production of circuit board 700. Capacitor 751 may take advantage of the nigh dielectric constant of diamond of 7,000 V/micron.

In general, circuit board 700 may be a computer circuit board to which electronic devices such as computer chips are attached. Circuit board 700 may be substantially composed of polycrystalline diamond. In some embodiments, the polycrystalline diamond may be hexagonal polycrystalline diamond. Circuit board 700 may be printed by 3-D printer 100 according to the method described above with respect to FIG. 6. In certain embodiments, 3-D printer 100 may print circuit board 700 by depositing layers of pre-ceramic polymer 115 without the use of a nanoparticle filler.

Figure 8:
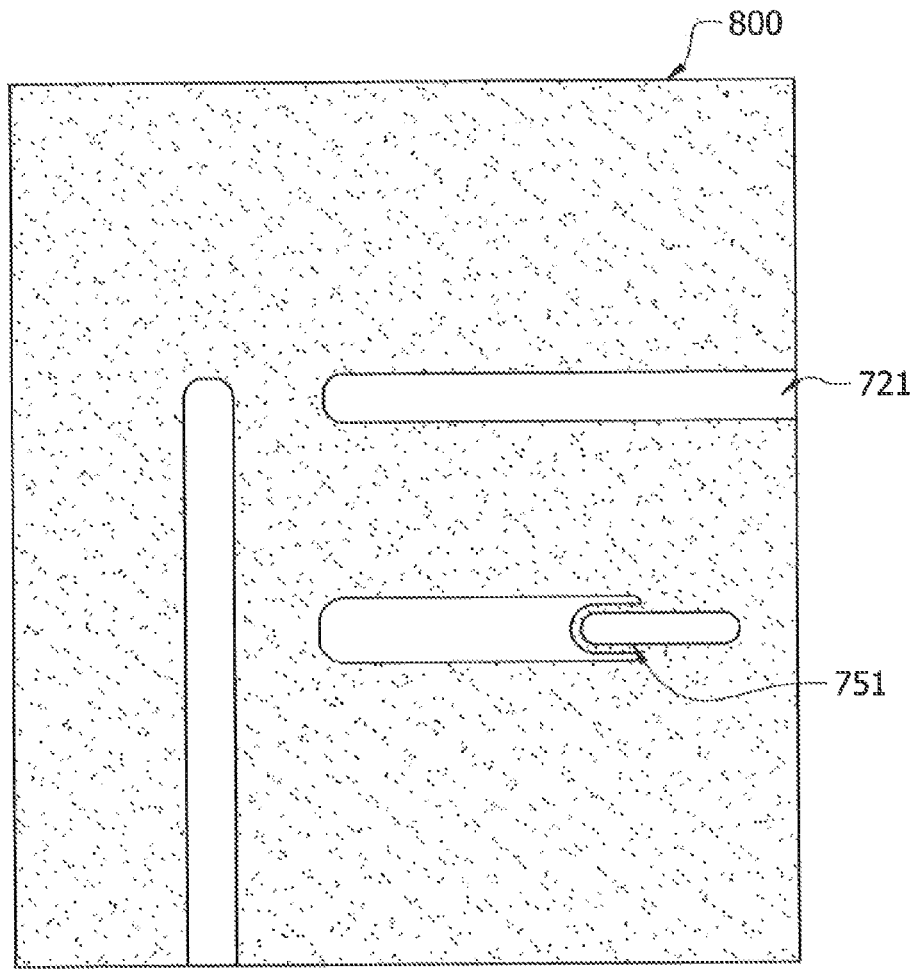
FIG. 8 illustrates an example cross section of the polycrystalline diamond PWB of FIG. 7, according to certain embodiments.

FIG. 8 illustrates an example cross section 800 of circuit board 700, according to certain embodiments. Cross section 800 may be representative of a layer printed by 3-D printer 100 in the printing of circuit board 700.

In particular embodiments, interconnects 721 may be able to conduct electricity. Electricity conducting interconnects 721 may be tubes of any shape, such as those illustrated in FIG. 9. These tubes may be substantially hollow and may have a variety of interior geometries including internal support structures. The inner surface of electricity conducting interconnects 721 may be composed of a layer of graphene. In some embodiments, the inner surface of electricity conducting interconnects 721 may be composed of a layer of polycrystalline diamond covering a layer of graphene, such that the layer of graphene is "sandwiched" between two polycrystalline diamond layers. The graphene layer may conduct electricity through interconnects 721. In certain embodiments, the graphene may more efficiently conduct electricity if it is "sandwiched" between two polycrystalline diamond layers. The polycrystalline diamond layers may serve to constraint phonons in the graphene layer.

In particular embodiments, interconnects 721 may have one or more tube openings 731. lube openings 731 may be open to the atmosphere, or any other environment in which circuit board 700 is used (for example, in space or under water). Tube openings 731 may allow the pressure within interconnects 721 to equalize to the outside environment. Equalization of pressure may prevent damage to circuit board 700 if the circuit board is used in environments where the pressure may vary. For example, if circuit board 700 is used onboard an aircraft, tube openings 731 may allow the pressure inside of interconnects 721 to equalize to the pressure of the altitude of the aircraft. In particular embodiments, interconnects 721 may not connect to any electrical devices, and instead serve as cooling passages through which a cooling fluid may be circulated. In these embodiments, tube openings 731 may provide points through which a cooling fluid may enter and exit circuit board 700.

Interconnects 721 may terminate at the surface of circuit board 700 at terminations 722. Terminations 722 may be arranged into an attachment pad 720. Attachment pad 720 may serve as the attachment point for electronic devices to circuit board 700. In particular embodiments, for example, attachment pad 720 may be in the shape of a ball grid array, which may allow for attachment of electronic devices using a standard ball grid array interface. In other embodiments, attachment pad 720 may be made of interconnect terminations 722 able to receive a connection from electronic devices having graphene connection points (e.g. electrically conductive setae) able to directly interface with interconnect terminations 722.

In some embodiments, attachment pad 720 may be countersunk into the surface of circuit board 700 such that electronic devices attached to attachment pad 720 may be mounted flush to the surface of circuit board 700. Countersunk attachment pads 720 may allow multiple circuit boards 700 to be stacked adjacent to one another. Adjacently stacked circuit boards 700 may be connected by interconnects 721 that may be arranged to pass vertically through circuit boards 700.

In some embodiments, interconnects 721 may include one or more capacitors 751, which may be formed by two adjacent interconnects 721 that terminate within circuit board 700 and are separated by a layer of polycrystalline diamond. The layer of polycrystalline diamond may act as a dielectric layer between layers of graphene that make up the inner surface of tubes 721. Interconnects 721 may terminate within circuit board 700 in a variety of geometries, thereby having an effect on the area of the polycrystalline diamond between interconnects 721. The area of the polycrystalline diamond dielectric between the layers of graphene may at least partially determine the capacitance of capacitor 751.

In certain embodiments, fins 740 may be formed on the surface of circuit board 700. In particular embodiments, fins 740 may be part of the polycrystalline diamond structure of circuit board 700. Fins 740 may conduct heat generated by circuit board 700 or by electronic devices attached to circuit board 700 away from circuit board 700. Fins 740 may be arranged in a variety of geometries over any surface of circuit board 700 as appropriate to attain a desired heat transfer from circuit board 700.

Figure 9:
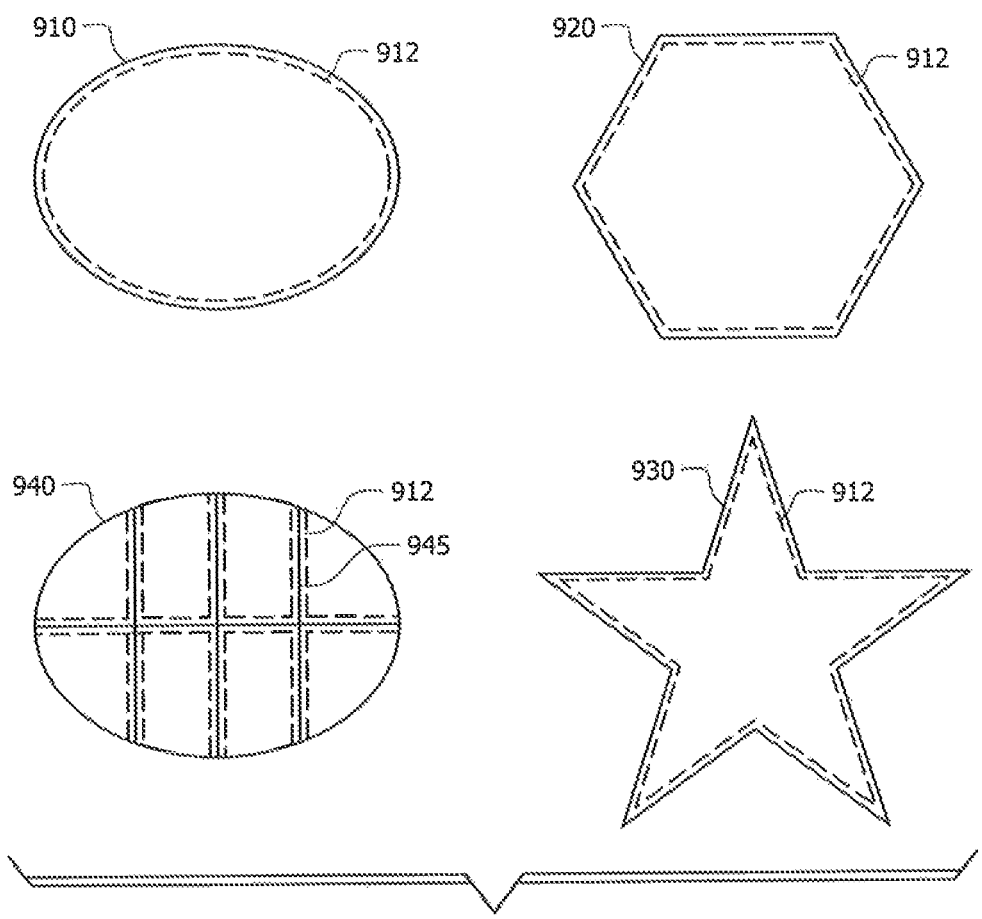
FIG. 9 illustrates example geometries of electrically conducting interconnects of the PSE of FIG. 7, according to certain embodiments.

FIG. 9 illustrates example geometries of interconnects 721, according to certain embodiments. Possible geometries of interconnects 721 may include a circular geometry 910 (e.g., a circle or an oval), a polygonal geometry 920 (e.g., any n-sided polygon such as a triangle, square, rectangle, pentagon, hexagon, heptagon, octagon, and the like), a star geometry 930, a fractal geometry (not illustrated), or a geometry 940 having internal support structures 945. Support structures 945 may be utilized in any geometry of interconnects 721 and may comprise polycrystalline diamond that may act to support interconnects 721. Support structures 945 may also increase the inner surface area of interconnects 721. Support structures 945 may be printed from poly(hydridocarbyne) during printing of circuit board 700 by 3-D printer 100 and may support interconnects 721 during the printing process. The surface of interconnects 721 may be composed of a layer of graphene 912. In certain embodiments, a layer of graphene 912 may also be present on the surface of support structures 945. Although FIG. 9 illustrates example geometries of interconnects 721 and support structures 945, any appropriate geometry may be used.

Figure 10:
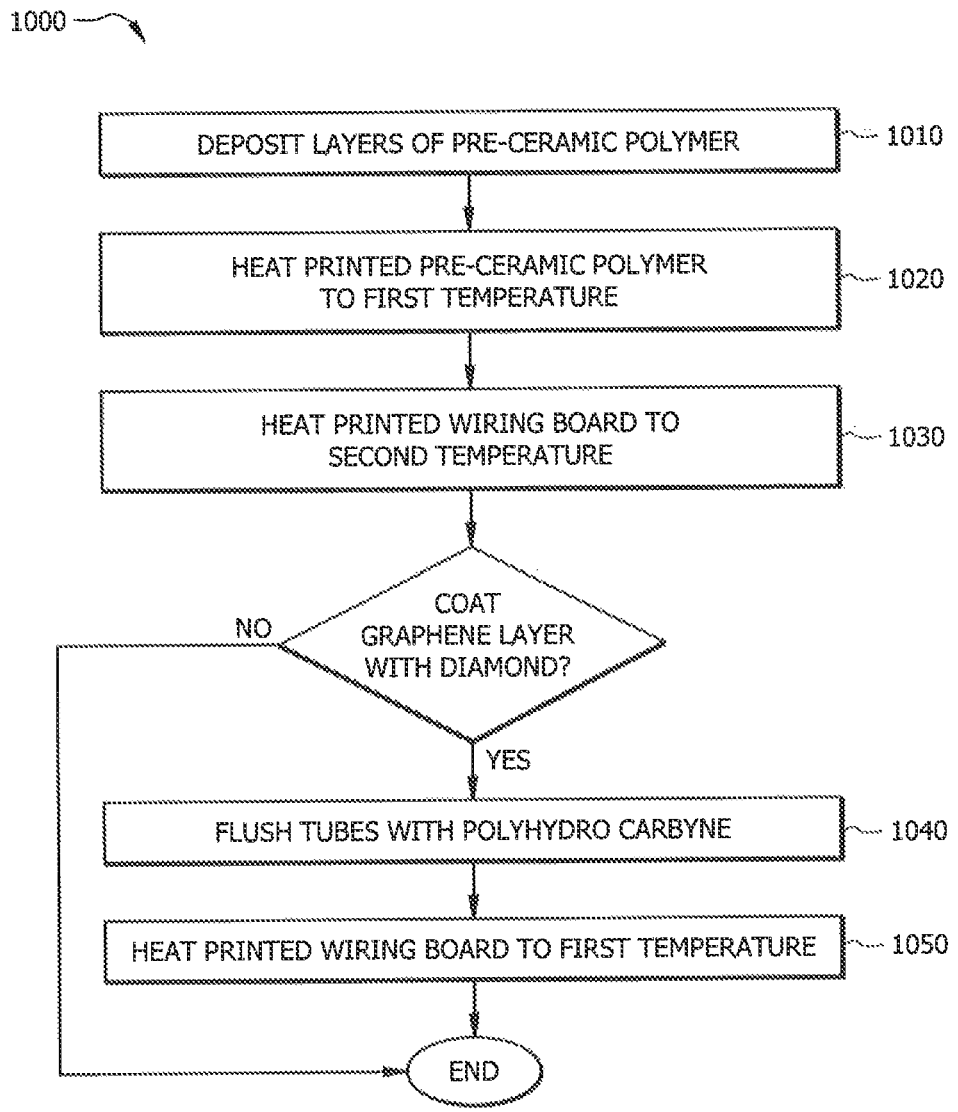
FIG. 10 illustrates an example method 1000 for printing the PWB of FIG. 7, according to certain embodiments.

FIG. 10 illustrates an example method 1000 for printing circuit board 700, according to certain embodiments. Method 1000 begins at step 1010 in which layers of pre-ceramic polymer are deposited having the geometry of circuit board 700. In some embodiments, the pre-ceramic polymer may be deposited according to the method illustrated in FIG. 6. However, in particular embodiments, pre-ceramic polymer may be deposited without the use of a ceramic powder. To form tubes that may act as electrically conducting interconnects or as coolant tubes, each layer of pre-ceramic polymer deposited may have areas in which no pre-ceramic polymer is deposited corresponding to the geometry of the tubes at that layer. To print a circuit board composed of polycrystalline diamond, poly(hydridocarbyne) may be used as the pre-ceramic polymer.

At step 1020, the printed pre-ceramic polymer in the shape of circuit board 700 may be heated to the decomposition temperature of the pre-ceramic polymer. For example, the heating may occur at a decomposition temperature that is between about 100 degrees Celsius and about 800 degrees Celsius. For example, the heating may occur at a temperature that is at least 100 degrees Celsius, plus or minus 0%-1%, 1%-5%, 5%-10%, or 10%-20%, but is less than 800 degrees Celsius, plus or minus 0%-1%, 1%-5%, 5%-10%, or 10%-20%. In an embodiment in which circuit board 700 is printed without the use of a ceramic powder, heating of circuit board 700 may be accomplished using a slow temperature ramp to prevent damage to circuit board 700. For example, the temperature may be increased, between 0.1 and 1.0 degrees Celsius per hour. In some embodiments, heating of the pre-ceramic polymer may occur in an inert atmosphere. Heating may cause the pre-ceramic polymer to decompose. Poly(hydridocarbyne) may decompose to form hexagonal polycrystalline diamond, and poly(methylsilyne) may decompose to form silicon carbide. In particular embodiments, optical photo-pyrolysis may also be used to "expose" or pyrolyze each entire printed layer of pre-ceramic polymer. In such an embodiment, there may be no need to bake the final item as it is converted layer-by-layer to diamond like carbon and/or diamond during each photopyrolysis exposure.

At step 1030, circuit board 700 may be heated to a second temperature that is higher than the decomposition temperature of the pre-ceramic polymer. For example, the heating may occur at a temperature that is about 900 degrees Celsius. For example, the heating may occur at a temperature that is at least 900 degrees Celsius, plus or minus 0%-1%, 1%-5%, 5%-10%, or 10%-20%. At this temperature, the polycrystalline diamond may thermolyze and graphene may form epitaxially on the surfaces of any polycrystalline diamond, or silicon carbide portions of circuit board 700 that had been formed at step 1020. For example, graphene may form on the interior surfaces of any interconnects 721 printed in circuit board 700. The graphene layer may allow interconnects 721 to conduct electricity.

In some embodiments, graphene may form on the outer surface of circuit board 700 in step 1030. In such embodiments, the graphene on the outer surface of circuit board 700 may be polished away after step 1030. In other embodiments, the outer surface of circuit board 700 may be coated in a carbide-forming metal before heating in step 1030. The carbide-forming metal coating may form a metal carbide layer that inhibits the formation of graphene on the surface of circuit board 700.

If it is desired to coat the graphene layer formed in step 1030 with polycrystalline diamond, then any interconnects 721 printed in circuit board 700 may be flushed with any appropriate substance such as poly(hydridocarbyne) at step 1040. Coating the graphene layer with polycrystalline diamond may provide for phonon confinement and increase the electrical conductivity of the graphene layer. If it is not desired to coat, the graphene layer with a layer of polycrystalline diamond, then method 1000 may end. Flushing interconnects 721 in circuit board 700 with poly(hydridocarbyne) at step 1040 may result in a coating of poly(hydridocarbyne) on the interior surface of the interconnects 721. The poly(hydridocarbyne) may be converted to polycrystalline diamond at step 1050 by heating circuit board 700 to a temperature approximately equal to the temperature used in step 1020. For example, the heating may occur at a temperature that is at least 100 degrees Celsius, plus or minus 0%-1%, 1%-5%, 5%-10%, or 10%-20%, but is less than 800 degrees Celsius, plus or minus 0%-1%, 1%-5%, 5%-10%, or 10%-20%. In some embodiments, heating at step 1050 may occur in an inert atmosphere. The heating in step 1050 may cause the poly(hydridocarbyne) to decompose, thereby forming polycrystalline diamond that covers the graphene layer on the interior surface of interconnects 721 formed in circuit board 700.

Figure 11A:
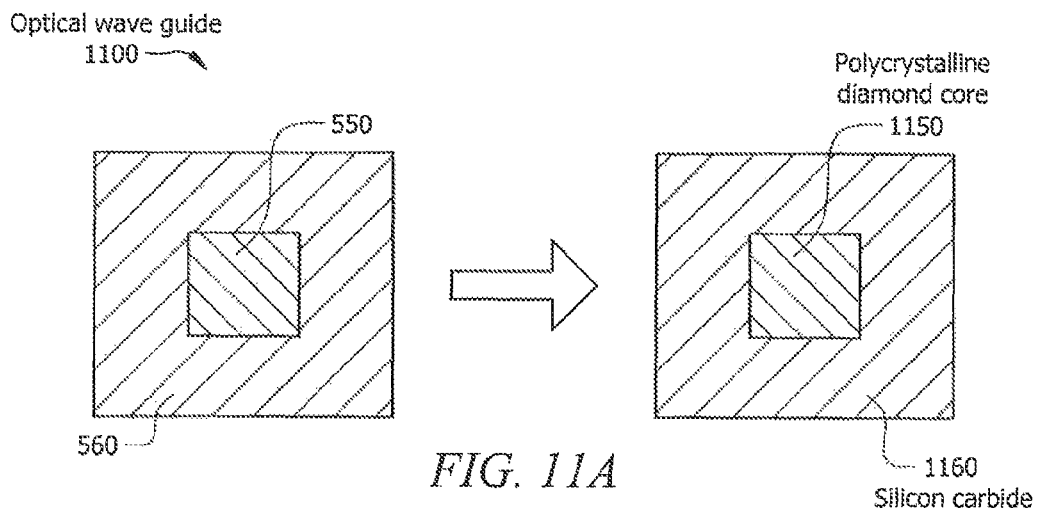
FIGS. 11A, 11B, and 11C illustrate example cross sections of an optical wave guide, according to certain embodiments.
Figure 11B:
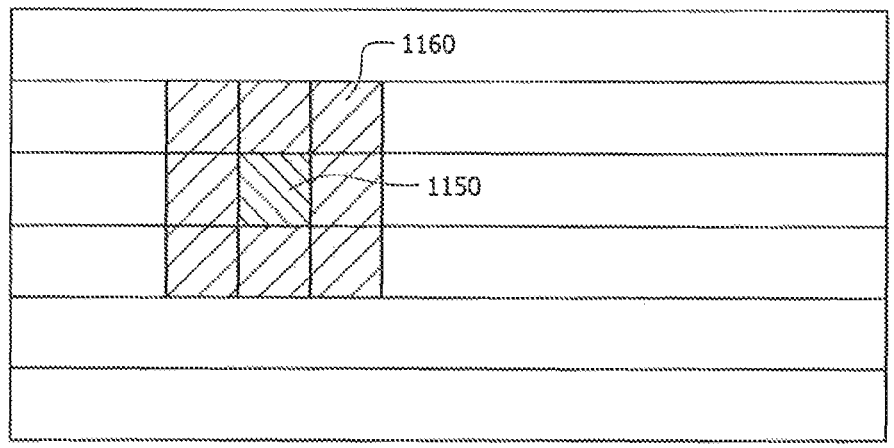
Figure 11C:
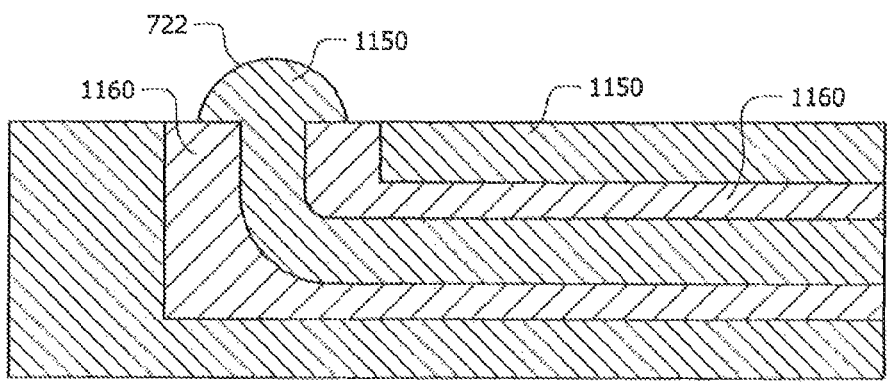

FIGS. 11A, 11B, and 11C illustrate example cross sections of an optical wave guide 1100, according to certain embodiments. Optical wave guide 1100 may include one or more interconnects 721 and transmit light between terminations 722 on circuit board 700. Optical wave guide 1100 may include a polycrystalline diamond core 1150 surrounded by silicon carbide 1160. Polycrystalline diamond core 1150 may transmit light along the length of optical wave guide 1100. In some embodiments, polycrystalline diamond core 1150 may have an index of refraction of approximately 2.419 and silicon carbide 1160 may have an index of refraction of approximately 2.69.

FIG. 11A illustrates an example cross section of optical wave guide 1100, transverse to the direction in which optical wave guide 1100 transmits light, before and after heating. 3-D printer 100 may print optical wave guide 1100 by depositing poly(hydridocarbyne) and poly(methylsilyne) to form a structure with a core of poly(hydridocarbyne) 550 surrounded by poly(methylsilyne) 560. In some embodiments, 3-D printer 100 may deposit a layer of poly(methylsilyne) 560, followed by a layer of poly(methylsilyne) 560 arranged adjacent to and to either side of poly(hydridocarbyne) 550, and followed by a layer of poly(methylsilyne) 550 to encapsulate the printed length of poly(hydridocarbyne) 550. After printing, the circuit board 700 containing optical wave guide 1100 may be heated to a decomposition temperature of the poly(hydridocarbyne) 550 and poly(methylsilyne) 560 to convert the poly(hydridocarbyne) 550 to polycrystalline diamond (i.e., polycrystalline diamond core 1150) and the poly(methylsilyne) 560 to silicon carbide (i.e., silicon carbide 1160). For example, the heating may occur at a decomposition temperature that is between about 100 degrees Celsius and about 800 degrees Celsius. For example, the heating may occur at a temperature that is at least 100 degrees Celsius, plus or minus 0%-1%, 1%-5%, 5%-10%, or 10%-20%, but is less than 800 degrees Celsius, plus or minus 0%-1%, 1%-5%, 5%-10%, or 10%-20%. In some embodiments, the heating may occur in an inert atmosphere.

FIG. 11b illustrates an example cross section of optical wave guide 1100, transverse to the direction in which optical wave guide 1100 transmits light, within circuit board 700 composed of polycrystalline diamond 1150. Optical wave guide 1100 may be surrounded by polycrystalline diamond that forms circuit board 700. FIG. 11b illustrates layers of polycrystalline diamond 1150 and layers of silicon carbide 1160 which may correspond to printed layers or poly(hydridocarbyne) and poly(methylsilyne), respectively. In some embodiments, printed layers of poly(hydridocarbyne) and poly(methylsilyne) may become indistinguishable after conversion to polycrystalline diamond 1150 and silicon carbide 1160, forming a contiguous structure of polycrystalline diamond 1150 and silicon carbide 1160 without apparent boundaries between printed layers. In some embodiments the cross-section of polycrystalline diamond core 1150 and silicon carbide may have any appropriate geometry such as a circular geometry (e.g., a circle or an oval), a polygonal geometry (e.g., any n-sided polygon such as a triangle, square, rectangle, pentagon, hexagon, heptagon, octagon, and the like), a star geometry, or a fractal geometry.

FIG. 11c illustrates an example cross section of optical wave guide 1100, along the direction in which optical wave guide 1100 transmits light, within circuit board 700 composed of polycrystalline diamond 1150. Optical wave guide 1100 may include an interconnect termination 722. In some embodiments, interconnect termination 722 may be a lens (e.g. a kinoform or diffractive lens) formed from polycrystalline diamond or silicon carbide. Termination 722 may serve to transmit light transmitted through optical wave guide 1100 to an electronic device mounted to circuit board 700, such as a computer chip, or off of circuit board 700 to another PWB. In particular embodiments, termination 722 may transmit light from a circuit board 700 to another PWB through an array of stacked PWBs, forming an optical data bus between PWBs. In particular embodiments, multiple optical wave guides 1100 and multiple electrically conducting interconnects 721 may be arranged throughout circuit board 700.

Figure 12A:
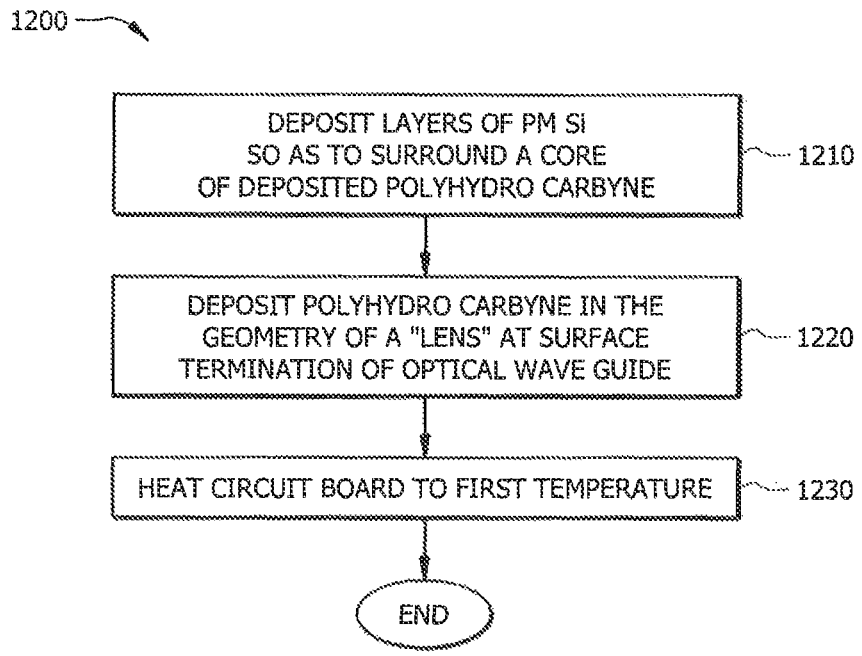
FIGS. 12A and 12B illustrate example methods for printing an optical wave guide within a polycrystalline diamond PWB, according to certain embodiments.
Figure 12B:
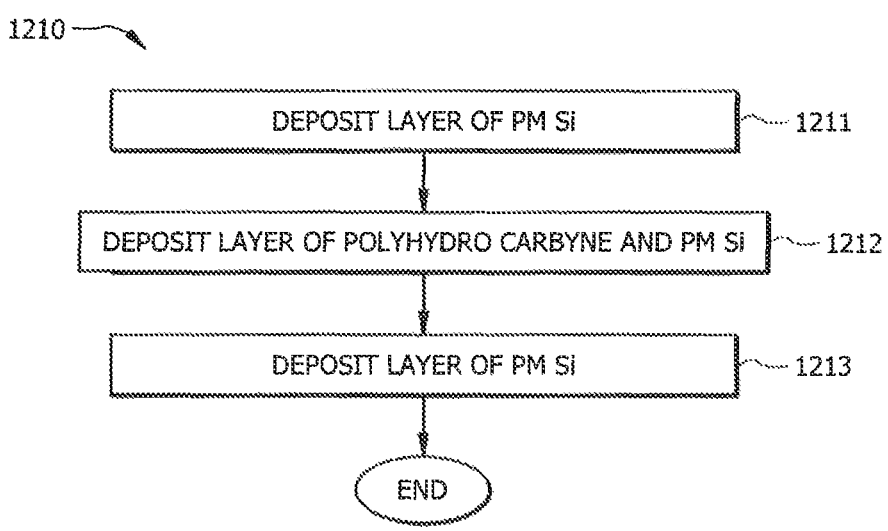

FIGS. 12a and 12b illustrate example methods 1200 and 1210 for printing an optical wave guide within a polycrystalline diamond PWB, such as circuit board 700, according to certain embodiments. Method 1200 begins at step 1210 where layers of poly(hydridocarbyne) and poly(methylsilyne) may be deposited so as to form the geometry of a core of poly(hydridocarbyne) surrounded by poly(methylsilyne). The layers of poly(hydridocarbyne) and poly (methylsilyne) may be deposited along with layers of poly(hydridocarbyne) that form the remainder of the circuit board during printing, such that the layers of poly(hydridocarbyne) and poly(methylsilyne) forming the optical wave guide may be "encased" within the layers poly(hydridocarbyne) forming the circuit board.

FIG. 12b illustrates an example of step 1210 of method 1200, for printing a horizontal length of an optical wave guide within a circuit board. The steps illustrated by FIG. 12b may be altered appropriately to accommodate printing other geometries of an optical wave guide, such as vertical lengths, angled lengths, or curved lengths. Step 1210 for printing a horizontal length of an optical wave guide begins at step 1211 where a layer of poly(methylsilyne) may be deposited along the horizontal length of the optical wave guide. Next at step 1212, a layer of poly(hydridocarbyne) and poly(methylsilyne) is printed on top of the layer of poly(methylsilyne) that was deposited in step 1211. The layer of poly(hydridocarbyne) and poly(methylsilyne) deposited at step 1212 may be arranged so that the poly (methylsilyne) is deposited adjacent to and on either side of the deposited poly(hydridocarbyne). At step 1213 a layer of poly(methylsilyne) may be deposited on top of the layer of poly(hydridocarbyne) and poly(methylsilyne) that was deposited in step 1212. After step 1213, additional layers of poly(hydridocarbyne) and poly(methylsilyne) may be deposited. For example, additional layers may be needed to terminate the optical wave guide at the surface of the circuit board. After depositing all layers necessary to form an optical wave guide within a printed circuit board, method 1200 may continue to step 1220.

At step 1220, layers of poly(hydridocarbyne) may be deposited on the surface of the circuit board at the terminations of the optical wave guide, in particular embodiments, the layers of poly(hydridocarbyne) may be deposited in the shape of a lens. At step 1230 the circuit board may be heated to a decomposition temperature of the poly(hydridocarbyne) and poly(methylsilyne) to convert the poly(hydridocarbyne) and poly(methylsilyne) into polycrystalline diamond and silicon carbide, respectively. In particular embodiments, optical photo-pyrolysis may also be used to "expose" or pyrolize each entire printed layer of pre-ceramic polymer. In such an embodiment, there may be no need to bake the final item as it is converted layer-by-layer to diamond like carbon and/or diamond during each photo-pyrolysis exposure.

Figure 13:
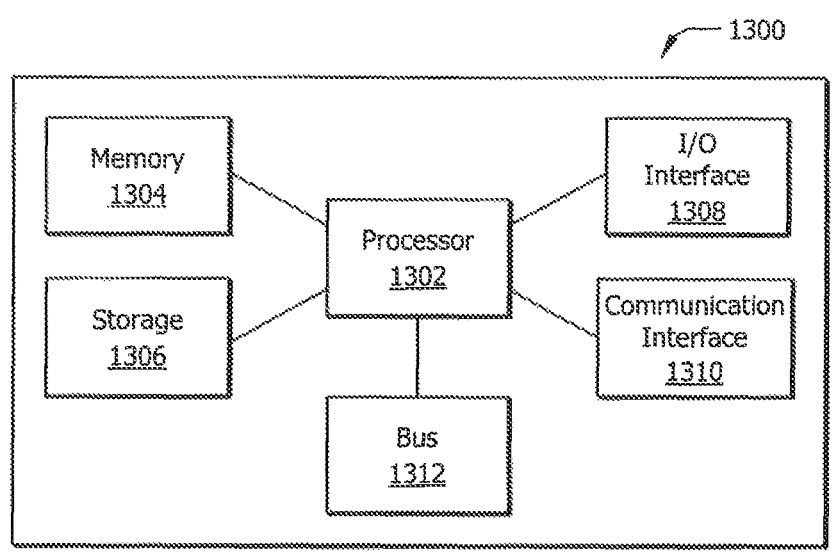
FIG. 13 illustrates an example computer system that may be used to control the 3-D printer of FIG. 1, according to certain embodiments.

FIG. 13 illustrates an example computer system 1300. Computer system 1300 may be utilized by computer system 150 of FIG. 1. In particular embodiments, one or more computer systems 1300 perform one or more steps of one or more methods described or illustrated herein. In particular embodiments, one or more computer systems 1300 provide functionality described or illustrated herein. In particular embodiments, software running on one or more computer systems 1300 performs one or more steps of one or more methods described, or illustrated herein or provides functionality described, or illustrated herein. Particular embodiments include one or more portions of one or more computer systems 1300. Herein, reference to a computer system may encompass a computing device, and vice versa, where appropriate. Moreover, reference to a computer system, may encompass one or more computer systems, where appropriate.

This disclosure contemplates any suitable number of computer systems 1300. This disclosure contemplates computer system 1300 taking any suitable physical form. As example and not by way of limitation, computer system 1300 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination or two or more of these. Where appropriate, computer system 1300 may include one or more computer systems 1300; be unitary or distributed; span multiple locations; span multiple machines; span multiple data centers; or reside in a cloud, which may include one or more cloud components in one or more networks. Where appropriate, one or more computer systems 1300 may perform without substantial spatial or temporal limitation one or more steps of one or more methods described or illustrated herein. As an example and not by way of limitation, one or more computer systems 700 may perform in real time or in batch mode one or more steps of one or more methods described or illustrated herein. One or more computer systems 1300 may perform at different times or at different locations one or more steps of one or more methods described or illustrated herein, where appropriate.

In particular embodiments, computer system 1300 includes a processor 1302, memory 1304, storage 1306, an input/output (I/O) interface 1308, a communication interface 1310, and a bus 1312. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1302 includes hardware for executing instructions, such as those making up a computer program. As an example and not by way of limitation, to execute instructions, processor 1302 may retrieve (or fetch) the instructions from an internal register, an internal cache, memory 1304, or storage 1306; decode and execute them; and then write one or more results to an internal register, an internal cache, memory 1304, or storage 1306. In particular embodiments, processor 1302 may include one or more internal caches for data, instructions, or addresses. This disclosure contemplates processor 1302 including any suitable number of any suitable internal caches, where appropriate. As an example and not by way of limitation, processor 1302 may include one or more instruction caches, one or more data caches, and one or more translation lookaside buffers (TLBs). Instructions in the instruction caches may be copies of instructions in memory 1304 or storage 1306, and the instruction caches may speed up retrieval of those instructions by processor 1302. Data in the data caches may be copies of data in memory 1304 or storage 1306 for instructions executing at processor 1302 to operate on; the results of previous instructions executed at processor 1302 for access by subsequent instructions executing at processor 1302 or for writing to memory 1304 or storage 1306; or other suitable data. The data caches may speed up read or write operations by processor 1302. The TLBs may speed up virtual-address translation for processor 1302. In particular embodiments, processor 1302 may include one or more internal registers for data, instructions, or addresses. This disclosure contemplates processor 1302 including any suitable number of any suitable internal registers, where appropriate. Where appropriate, processor 1302 may include one or more arithmetic Logic units (ALUs); be a multi-core processor; or include one or more processors 1302. Although this disclosure describes and illustrates a particular processor, this disclosure contemplates any suitable processor.

In particular embodiments, memory 1304 includes main memory for storing instructions for processor 1302 to execute or data for processor 1302 to operate on. As an example and not by way of limitation, computer system 1300 may load instructions from storage 1306 or another source (such as, for example, another computer system 1300) to memory 1304. Processor 1302 may then load the instructions from memory 1304 to an internal register or internal cache. To execute the instructions, processor 1302 may retrieve the instructions from the internal register or internal, cache and decode them. During or after execution of the instructions, processor 1302 may write one or more results (which may be intermediate or final results) to the internal register or internal cache. Processor 1302 may then write one or more of those results to memory 1304. In particular embodiments, processor 1302 executes only instructions in one or more internal registers or internal caches or in memory 1304 (as opposed to storage 1306 or elsewhere) and operates only on data in one or more internal registers or internal caches or in memory 1304 (as opposed to storage 1306 or elsewhere). One or more memory buses (which may each include an address bus and a data bus) may couple processor 1302 to memory 1304. Bus 1312 may include one or more memory buses, as described below. In particular embodiments, one or more memory management units (MMUs) reside between processor 1302 and memory 1304 and facilitate accesses to memory 1304 requested by processor 1302. In particular embodiments, memory 1304 includes random access memory (RAM). This RAM may be volatile memory, where appropriate. Where appropriate, this RAM may be dynamic RAM (DRAM) or static RAM (SRAM), Moreover, where appropriate, this RAM may be single-ported or multi-ported RAM. This disclosure contemplates any suitable RAM. Memory 1304 may include one or more memories 1304, where appropriate. Although this disclosure describes and illustrates particular memory, this disclosure contemplates any suitable memory.

In particular embodiments, storage 1306 includes mass storage for data or instructions. As an example and not by way of limitation, storage 1306 may include a hard disk drive (HDD), a floppy disk drive, flash memory, an optical, disc, a magneto-optical disc, magnetic tape, or a Universal Serial Bus (USB) drive or a combination of two or more of these. Storage 1306 may include removable or non-removable (or fixed) media, where appropriate. Storage 1306 may be internal or external to computer system 1300, where appropriate. In particular embodiments, storage 1306 is non-volatile, solid-state memory. In particular embodiments, storage 1306 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1306 taking any suitable physical form. Storage 1306 may include one or more storage control units facilitating communication between processor 1302 and storage 1306, where appropriate. Where appropriate, storage 1306 may include one or more storages 1306. Although this disclosure describes and illustrates particular storage, this disclosure contemplates any suitable storage.

In particular embodiments, I/O interface 1308 includes hardware, software, or both, providing one or more interfaces for communication between computer system. 1300 and one or more I/O devices. Computer system 1300 may include one or more of these I/O devices, where appropriate. One or more of these I/O devices may enable communication between a person and computer system 1300.

As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1308 for them. Where appropriate, I/O interface 1308 may include one or more device or software drivers enabling processor 1302 to drive one or more of these I/O devices. I/O interface 1308 may include one or more I/O interfaces 1308, where appropriate. Although this disclosure describes and illustrates a particular I/O interface, this disclosure contemplates any suitable I/O interface.

In particular embodiments, communication interface 1310 includes hardware, software, or both providing one or more interfaces for communication (such as, for example, packet-based communication) between computer system 1300 and one or more other computer systems 1300 or one or more networks. As an example and not by way of limitation, communication interface 1310 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1310 for it. As an example and not by way of limitation, computer system 1300 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1300 may communicate with a wireless PAN (WPAN) (such as, for example, a BLUETOOTH WPAN), a WI-FI network, a WI-MAX network, a cellular telephone network (such as, for example, a Global System, for Mobile Communications (GSM) network), or other suitable wireless network or a combination of two or more of these. Computer system 1300 may include any suitable communication interface 1310 for any of these networks, where appropriate. Communication interface 1310 may include one or more communication interfaces 1310, where appropriate. Although this disclosure describes and illustrates a particular communication interface, this disclosure contemplates any suitable communication interface.

In particular embodiments, bus 1312 includes hardware, software, or both coupling components of computer system 1300 to each other. As an example and not by way of limitation, bus 1312 may include an Accelerated Graphics Port (AGP) or other graphics bus, an Enhanced Industry Standard Architecture (EISA) bus, a front-side bus (FSB), a HYPERTEARSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1312 may include one or more buses 1312, where appropriate. Although this disclosure describes and illustrates a particular bus, this disclosure contemplates any suitable bus or interconnect.

The components of computer system 1300 may be integrated or separated. In some embodiments, components of computer system 1300 may each be housed within a single chassis. The operations of computer system 1300 may be performed by more, fewer, or other components. Additionally, operations of computer system 1300 may be performed using any suitable logic that may comprise software, hardware, other logic, or any suitable combination of the preceding.

Modifications, additions, or omissions may be made to the methods described herein without departing from the scope of the invention. For example, the steps may be combined, modified, or deleted where appropriate, and additional steps may be added. Additionally, the steps may be performed in any suitable order without departing from the scope of the present disclosure.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. An apparatus comprising:
   a circuit board made of polycrystalline diamond; and
   a substantially hollow tube formed within the circuit board, the tube terminating at one or more surfaces of the circuit board, the tube comprising a layer of graphene that is operable to permit the tube to conduct electrical current.

2. The apparatus of claim 1, wherein the layer of graphene forms an outer surface of the tube.

3. The apparatus of claim 1, wherein the tube further comprises a layer of polycrystalline diamond that forms an outer surface of the tube, the layer of polycrystalline diamond being deposited over the layer of graphene.

4. The apparatus of claim 1, wherein the tube further comprises one or more internal support structures.

5. The apparatus of claim 1, further comprising a capacitor formed within the circuit board, the capacitor comprising:
   a first layer of graphene;
   a second layer of graphene; and
   a layer of polycrystalline diamond located between the first and second layers of graphene.

6. The apparatus of claim 1, further comprising one or more cooling tubes formed within the circuit board, the cooling tubes configured to transmit a liquid through at least a portion of the circuit board.

7. The apparatus of claim 1, further comprising a plurality of heat sink fins formed on a surface of the circuit board, the plurality of heat sink fins made of polycrystalline diamond, the plurality of fins operable to conduct heat away from the circuit board.

8. The apparatus of claim 1, further comprising an electrical device connected to the tube at a termination of the tube.

9. The apparatus of claim 1, wherein at least one termination of the tube is open to an atmosphere.

10. The apparatus of claim 1, wherein the polycrystalline diamond comprises hexagonal polycrystalline diamond.

* * * * *

UNITED STATES PATENT AND TRADEMARK OFFICE
CERTIFICATE OF CORRECTION

PATENT NO. : 9,504,158 B2  
APPLICATION NO. : 14/258448  
DATED : November 22, 2016  
INVENTOR(S) : David G. Findley Page 1 of 1

It is certified that error appears in the above-identified patent and that said Letters Patent is hereby corrected as shown below:

On the Title Page

At Item (73) Assignee, please delete "Facebook, Inc., Menlo Park, CA (US)" and insert -- Lockheed Martin Corporation, Bethesda, MD (US) --.

Signed and Sealed this
Fourteenth Day of April, 2020

Andrei Iancu
*Director of the United States Patent and Trademark Office*